United States Patent [19]

Takase et al.

[11] Patent Number: 5,355,331
[45] Date of Patent: Oct. 11, 1994

[54] SEMICONDUCTOR MEMORY DEVICE HAVING ELECTRICALLY ISOLATED MEMORY AND LOGIC SECTIONS

[75] Inventors: Shinsuke Takase, Yokohama; Toshiya Kato, Zama, both of Japan

[73] Assignee: Kabushiki Kaisha Toshiba, Kawasaki, Japan

[21] Appl. No.: 185,169

[22] Filed: Jan. 24, 1994

Related U.S. Application Data

[63] Continuation of Ser. No. 687,733, Apr. 19, 1991, abandoned.

[30] Foreign Application Priority Data

Apr. 21, 1990 [JP] Japan ................... 2-105908

[51] Int. Cl.⁵ .............................................. G11C 7/00
[52] U.S. Cl. .................................. 365/154; 365/201; 365/189.09
[58] Field of Search ........... 365/154, 201, 227, 189.09, 365/189.11; 371/21.1; 257/904

[56] References Cited

U.S. PATENT DOCUMENTS

| | | | |
|---|---|---|---|
| 5,132,929 | 7/1992 | Ochii | 365/201 |
| 5,140,557 | 8/1992 | Yoshida | 365/227 |
| 5,159,571 | 10/1992 | Ito et al. | 365/154 |

FOREIGN PATENT DOCUMENTS

| | | | |
|---|---|---|---|
| 0107355 | 5/1984 | European Pat. Off. | |
| 0327861 | 2/1988 | European Pat. Off. | |
| 55-89984 | 7/1980 | Japan | 365/227 |
| 2067836 | 7/1981 | United Kingdom | |

*Primary Examiner*—Rolf Hille
*Assistant Examiner*—Robert Limanek
*Attorney, Agent, or Firm*—Finnegan, Henderson, Farabow, Garrett & Dunner

[57] ABSTRACT

According to this invention, there is disclosed a semiconductor device in which a memory section and a logic section are arranged on the same semiconductor chip, comprising a high-resistance element constituting a memory cell, a low-resistance line connected to the high-resistance element, a power source line serving as a power source path from a power source pad, a switching element arranged between the low-resistance line and the power source line, and a control circuit for controlling the switching element.

9 Claims, 5 Drawing Sheets

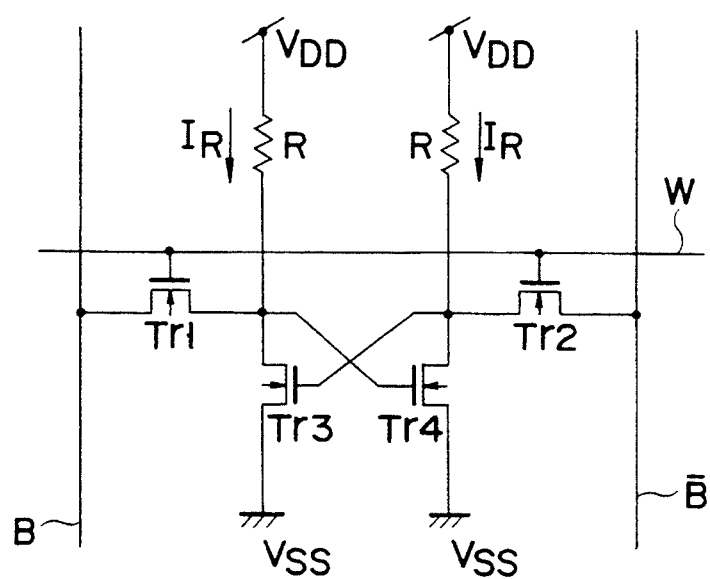
F I G. 1
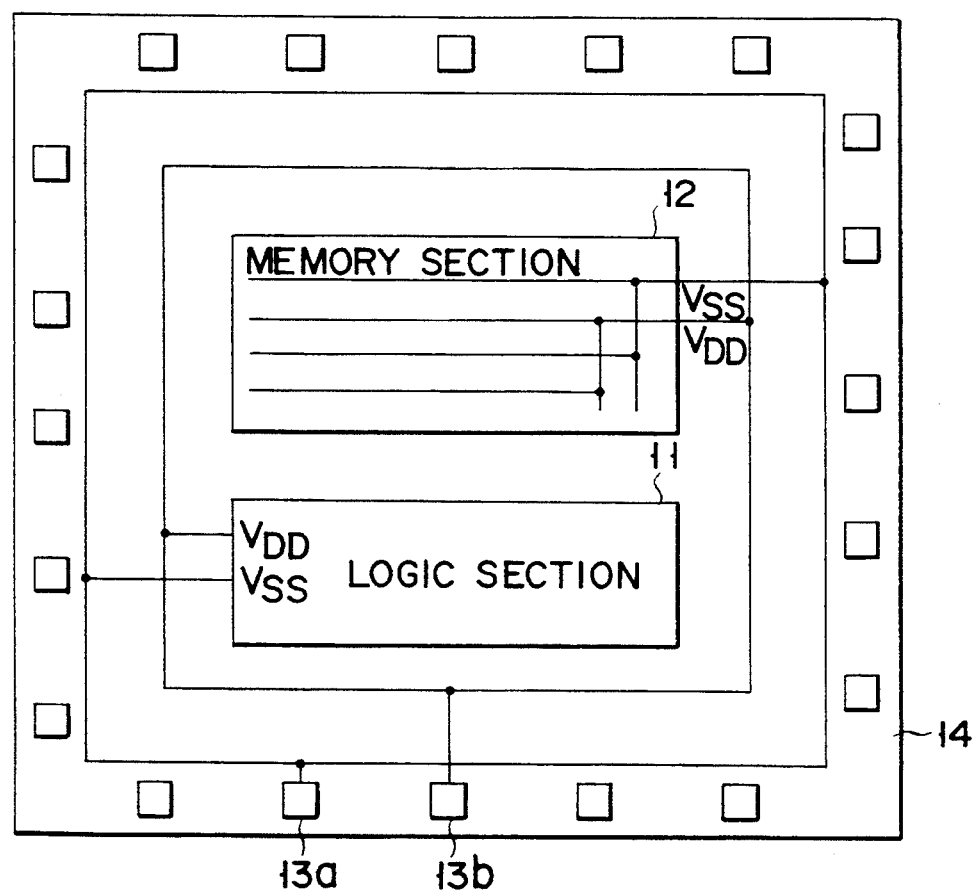
F I G. 2

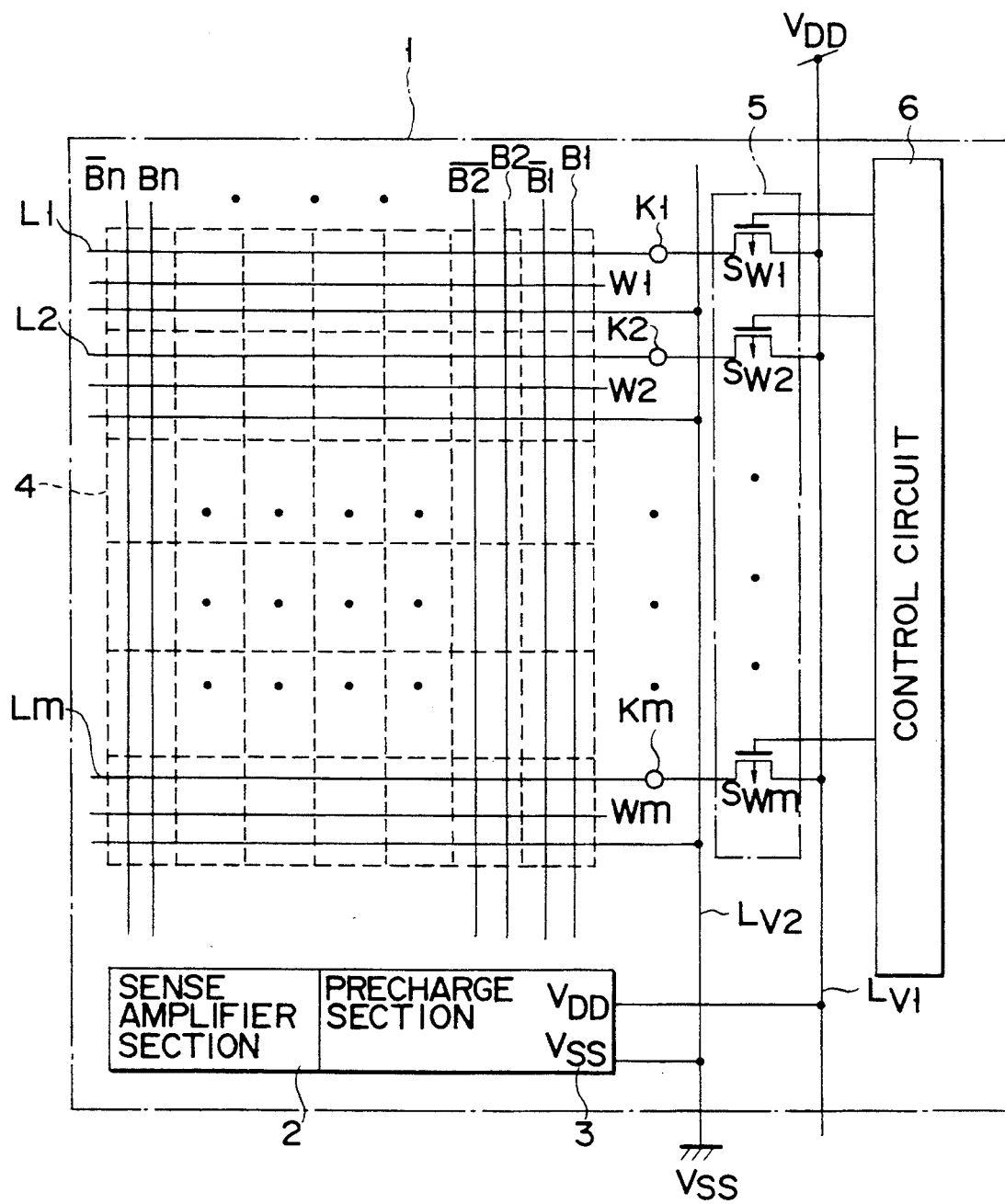
F I G. 4

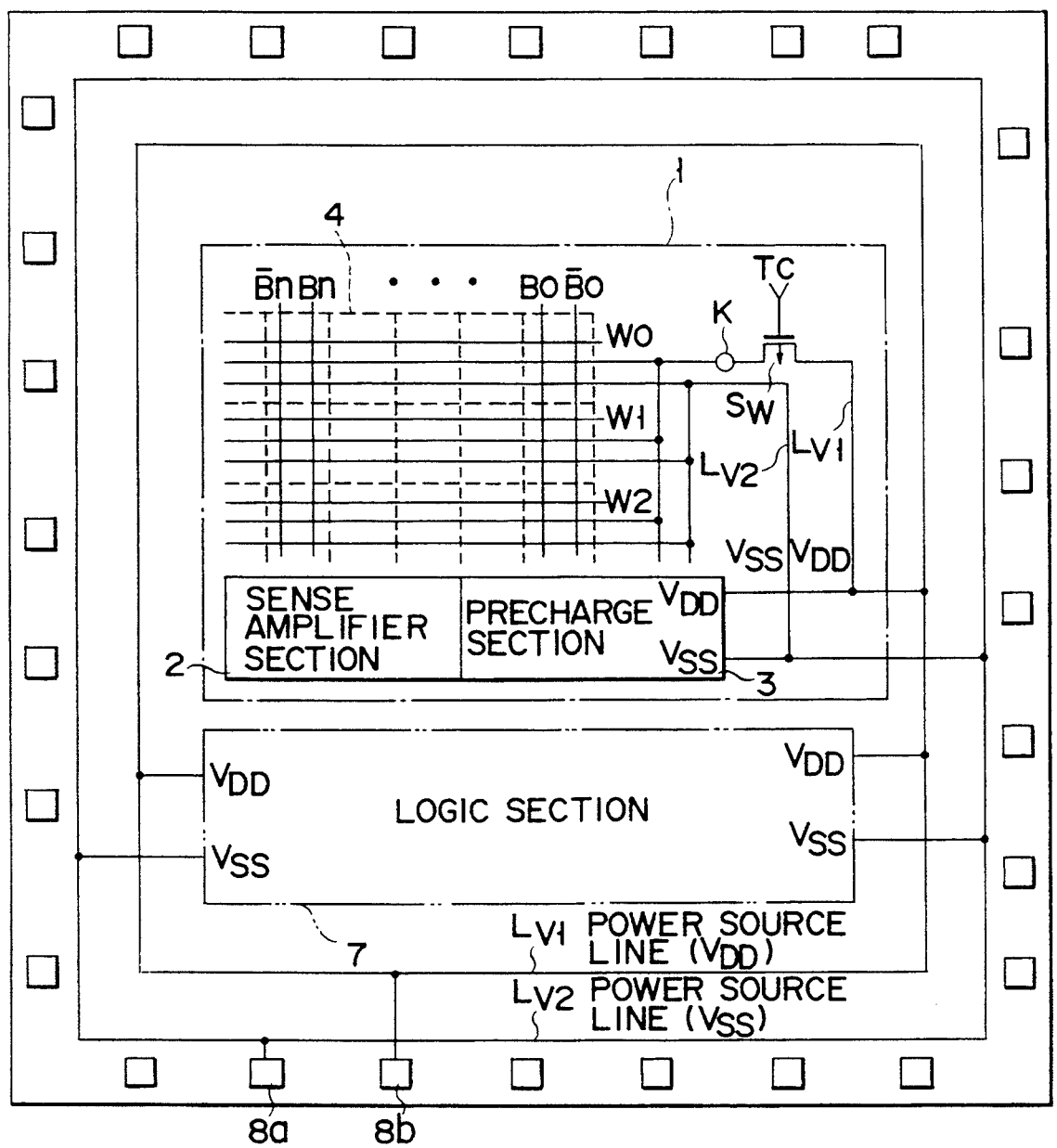
F I G. 6

SEMICONDUCTOR MEMORY DEVICE HAVING ELECTRICALLY ISOLATED MEMORY AND LOGIC SECTIONS

This application is a continuation, of application Ser. No. 07/687,733, filed Apr. 19, 1991, now abandoned.

BACKGROUND OF THE INVENTION

1. Field of the Invention

The present invention relates to a semiconductor memory device and, more particularly, to a semiconductor memory device used for controlling power consumption of an IC on which a high-resistance load type static RAM and a logic circuit are mounted.

2. Description of the Related Art

Conventionally, memory cells of a high-resistance load type static RAM, i.e., an E/R type static RAM (Enhancement/Resistor type static RAM to be referred to as "E/R type SRAM" hereinafter) have a circuit arrangement, e.g., shown in FIG. 1. Referring to FIG. 1, reference symbol $V_{DD}$ denotes a positive power source voltage; $V_{SS}$, a ground power source voltage; R, a high-resistance load; Tr1 and Tr2, transferring gates constituted by n-channel MOS transistors; Tr3 and Tr4, driver transistors constituted by n-channel MOS transistors; B and $\bar{B}$, bit lines; and W, word lines.

In general, the high-resistance load R used in the memory cell of the E/R type SRAM is constituted by a second polysilicon layer to decrease an area occupied by the memory cell. This can be achieved by a two-layer polysilicon technique in which the gate electrodes of the MOS transistors are constituted by a first polysilicon layer, and the high-resistance load R is constituted by the second polysilicon layer. In addition, in the high-resistance load type cell, since a data retention current (standby current, to be referred to as "leakage current" hereinafter) $I_R$ is changed according to the resistance of the high-resistance load R, the resistance generally has a large value.

As the first characteristic of the E/R type SRAM, the E/R type SRAM is integrated at a high density. When the two-layer polysilicon technique is used, as described above, the first polysilicon layer is used as the gate electrodes of the MOS transistors Tr1 to Tr4, and the high-resistance load R can be formed by the second polysilicon layer formed on the MOS transistors Tr1 to Tr4. As the second characteristic, a relatively small leakage current $I_R$ can be obtained by a technique for increasing the resistance of the polysilicon layer. Therefore, in the above load cell, it is generally advantageous that the load R has a resistance as high as possible. Note that, at present, an increase in resistance of the load R is a required condition for obtaining a large-capacity memory. For example, in a 1-Mbit SRAM, in order to obtain a leakage current $I_R$ of several $\mu A$ (micro ampere), each memory cell is required to have a load resistance of several tera ohms ($10^{12}\,\Omega$) or more. However, in consideration of a margin in the actual manufacture, a resistance of several tera ohms or more is difficult to always obtain, and the leakage current $I_R$ has variations in the range of several $\mu A$ to several hundred $\mu A$, i.e., the maximum variation being hundred times or more the minimum variation.

In a semiconductor memory device on which an E/R type SRAM and a logic circuit are mounted, as shown in FIG. 2, power source voltages $V_{DD}$ and $V_{SS}$ of a logic section 11 and power source voltages $V_{DD}$ and $V_{SS}$ in a memory section 12 of the E/R type SRAM are generally applied from the same power source pads 13a and 13b. Therefore, when the power consumption of a semiconductor chip 14 is evaluated, the power consumption of all the E/R type SRAM and the logic section must be evaluated. A total current is evaluated at present.

For example, in the semiconductor chip 14 on which a large-capacity E/R type SRAM and a logic section are mounted, a variation in the leakage current $I_R$ from a memory section 12 of the E/R type SRAM is larger than that of a leakage current from the logic section 11. That is, when a total leakage current of the semiconductor chip 14 is evaluated, since the static current consumption of the logic section 11 is generally about 100 $\mu A$, the leakage current from the logic section 11 and a current obtained by varying the leakage current $I_R$ from the memory section 12 of the E/R type SRAM cannot be distinguished from each other.

Note that the logic section 11 and the memory section 12 of the E/R type SRAM have different device arrangements, and a defective device may be formed in manufacturing. The logic section 11 and the memory section 12 must be independently discriminated from each other. Therefore, the independent discrimination of errors of leakage currents from the logic section 11 and the memory section 12 of the E/R type SRAM is one of the important factors. However, in a conventional circuit arrangement, this independent discrimination cannot be performed.

As described above, in a conventional semiconductor memory device, although the independent discrimination of errors of the leakage currents from the logic section and the memory section of the E/R type SRAM is important, it cannot be performed, resulting in inconvenience.

SUMMARY OF THE INVENTION

It is, therefore, an object of the present invention to provide a semiconductor memory device capable of independently discriminating and evaluating leakage currents from a memory section of a large-capacitance E/R type SRAM and a logic section, and cutting off an unnecessary leakage current during the use of the memory device.

In order to achieve the above object, according to the present invention, a semiconductor memory device comprises a memory cell having a high-resistance element, a line connected to the high-resistance element of the memory cell, and a switching element connected between the line and a power source.

A semiconductor memory device further comprises a memory cell array obtained by arranging memory cells having high-resistance elements in an array form, a line connected each of high-resistance elements of the memory cells commonly connected to word or bit lines, and a switching element connected between the line and a power source.

In addition, a semiconductor memory device comprises a memory cell having a high-resistance element, a line connected to the high-resistance element of the memory cell, a switching element connected between the line and the power source, and a control circuit for ON/OFF-controlling the switching element.

A semiconductor memory device comprises a memory cell array obtained for arranging memory cells having high-resistance elements in an array form, a line connected each of high-resistance elements of the memory cells commonly connected to word or bit lines in the memory cell array, a switching element connected between the line and the power source, and a control circuit for ON/OFF-controlling the switching element.

According to the above arrangement, a switching element is connected between the line connected to a high-resistance element and a power source in a memory cell. For this reason, the switching element is ON/OFF-controlled to be able to disconnect all memory cells from the power source. Therefore, even in a large-capacity E/R type SRAM, a leakage current generated from a memory section and a leakage current generated from a logic section can be independently discriminated and evaluated.

In addition, during the use of the semiconductor memory device, since only a nonused memory cell can be separated from a power source, the semiconductor memory device can be used while an unnecessary leakage current is cut off.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing a memory cell of a conventional E/R type SRAM;

FIG. 2 is a circuit diagram showing a conventional semiconductor memory device on mounted a chip;

FIG. 4 is a circuit diagram showing a semiconductor memory device according to the second embodiment of the present invention;

FIG. 6 is a circuit diagram showing a semiconductor device according to the fourth embodiment of the present invention mounted on a chip.

DETAILED DESCRIPTION OF THE PREFERRED EMBODIMENTS

Figure 3:
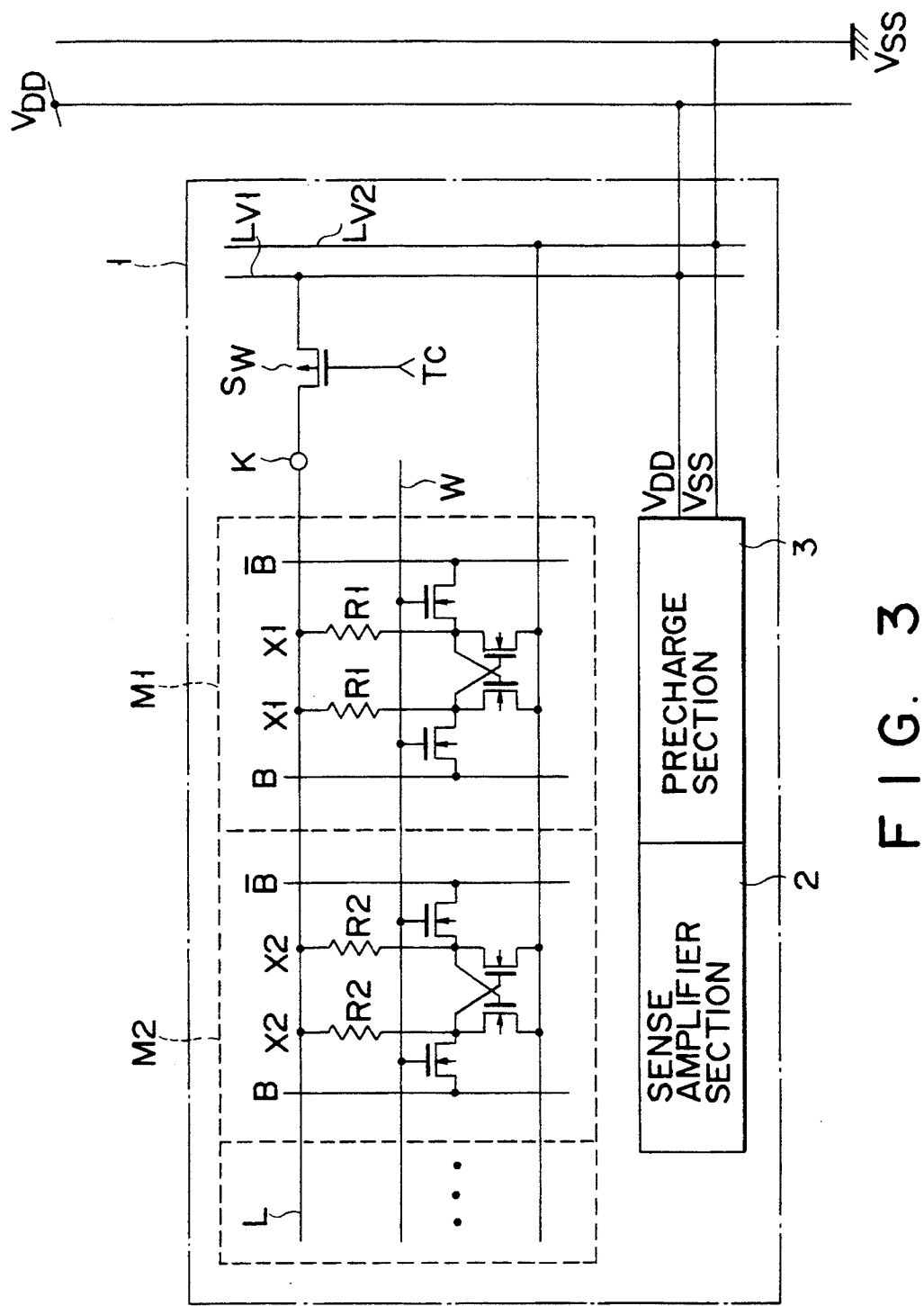
FIG. 3 is a circuit diagram showing a semiconductor memory device according to the first embodiment of the present invention.

An embodiment of the present invention will be described below with reference to the accompanying drawings, FIG. 3 shows a semiconductor memory device according to the first embodiment of the present invention.

In the first to fourth embodiments shown in FIGS. 3 to 6, although a memory section and a logic section are mounted on a semiconductor chip, only the memory section is shown in each of FIGS. 3 to 6.

A power source voltage is applied from the same power source pad to the memory and logic sections, Reference numeral 1 denotes a memory section of an E/R type SRAM. That is, n memory cells $M_1$, $M_2$, ... , $M_n$ are arranged in the memory section 1 in an array form. A memory cell array is constituted by the memory cells $M_1$, $M_2$, ..., $M_n$. A sense amplifier section 2 and a precharging section 3 are formed as peripheral circuits. In addition, high-resistance elements $R_1$, $R_2$, ..., $R_n$ of the n memory cells $M_1$, $M_2$, ..., $M_n$ are connected to predetermined nodes $X_1$, $X_2$, ..., $X_n$, respectively. The nodes $X_1$, $X_2$, ..., $X_n$ are connected to a terminal K by a low-resistance line L. A switching element (e.g., a MOS transistor) Sw having an ON resistance ($10^2$ to $10^4$ Ω or less) much lower than those of the high-resistance elements (resistances of $10^{10}$ to $10^{12}$ Ω or less) $R_1$, $R_2$, ..., $R_n$ of the memory cells $M_1$, $M_2$, ..., $M_n$ is connected between the terminal K and a power source line Lvl. The switching element Sw is used for disconnecting the n memory cells $M_1$, $M_2$, ..., $M_n$ from the power source line Lvl by a control signal Tc from a control circuit (not shown) as needed.

With the above arrangement, the switching element Sw having an ON resistance very lower than those of the high-resistance elements $R_1$, $R_2$, ..., $R_n$ of the memory cells $M_1$, $M_2$, ..., $M_n$ is connected between the terminal K and the power source line Lvl. For this reason, when a leakage current is evaluated, the n memory cells $M_1$, $M_2$, ..., $M_n$ can be disconnected from the power source line Lvl, and leakage currents can be evaluated in parts except for the memory cells $M_1$, $M_2$, ..., $M_n$ of the E/R type SRAM can be evaluated.

Since the switching element Sw is constituted by, e.g., a MOS transistor having an very low ON resistance ($10^2$ to $10^4$ Ω or less), the switching element Sw can be laid out while the pattern area of the switching element Sw does not influence the chip area. That is, the switching element Sw can be obtained by a current process technique.

FIG. 4 shows a semiconductor memory device according to the second embodiment of the present invention.

A memory cell array 4 constituted by arranging n×m memory cells in an array form is formed in a memory section 1. A sense amplifier section 2 and a precharge section 3 are formed as peripheral circuits. In addition, the high-resistance elements (not shown) of the n×m memory cells arranged in an array form are connected to predetermined terminals $K_l$ to $K_m$ by predetermined low-resistance lines $L_l$ to $L_m$, respectively. That is, the low-resistance lines $L_l$ to $L_m$ are arranged parallelly to word lines $W_l$ to $W_m$ and vertically to bit lines $B_l$ to $B_n$, and $\overline{B_l}$ to $\overline{B_n}$. The low-resistance lines $L_l$ to $L_m$ are provided in units of the word lines $W_l$ to $W_m$ and connected to the high-resistance elements of the memory cells commonly connected to the word lines $W_l$ to $W_m$. That is, one low-resistance line is provided to one word line, and one low-resistance line is connected to the high-resistance elements of the memory cells connected to the same word line. In addition, switching elements Sw1 to Swm each having an ON resistance ($10^2$ to $10^4$ Ω or less) much lower than that of a high-resistance element (resistance of $10^{10}$ to $10^{12}$ Ω) of a memory cell are connected between terminals $K_l$ to $K_m$ and a power source line Lvl. Note that a Switching circuit 5 is constituted by the switching elements Sw1 to Swm. The opening/closing of the switching elements Sw1 to Swm is controlled by a control signal from a control circuit (e.g., decoder) 6. Note that the switching elements Sw1 to Swm are simultaneously ON/OFF-controlled, and an arbitrary number of elements may be ON/OFF-controlled.

Figure 5:
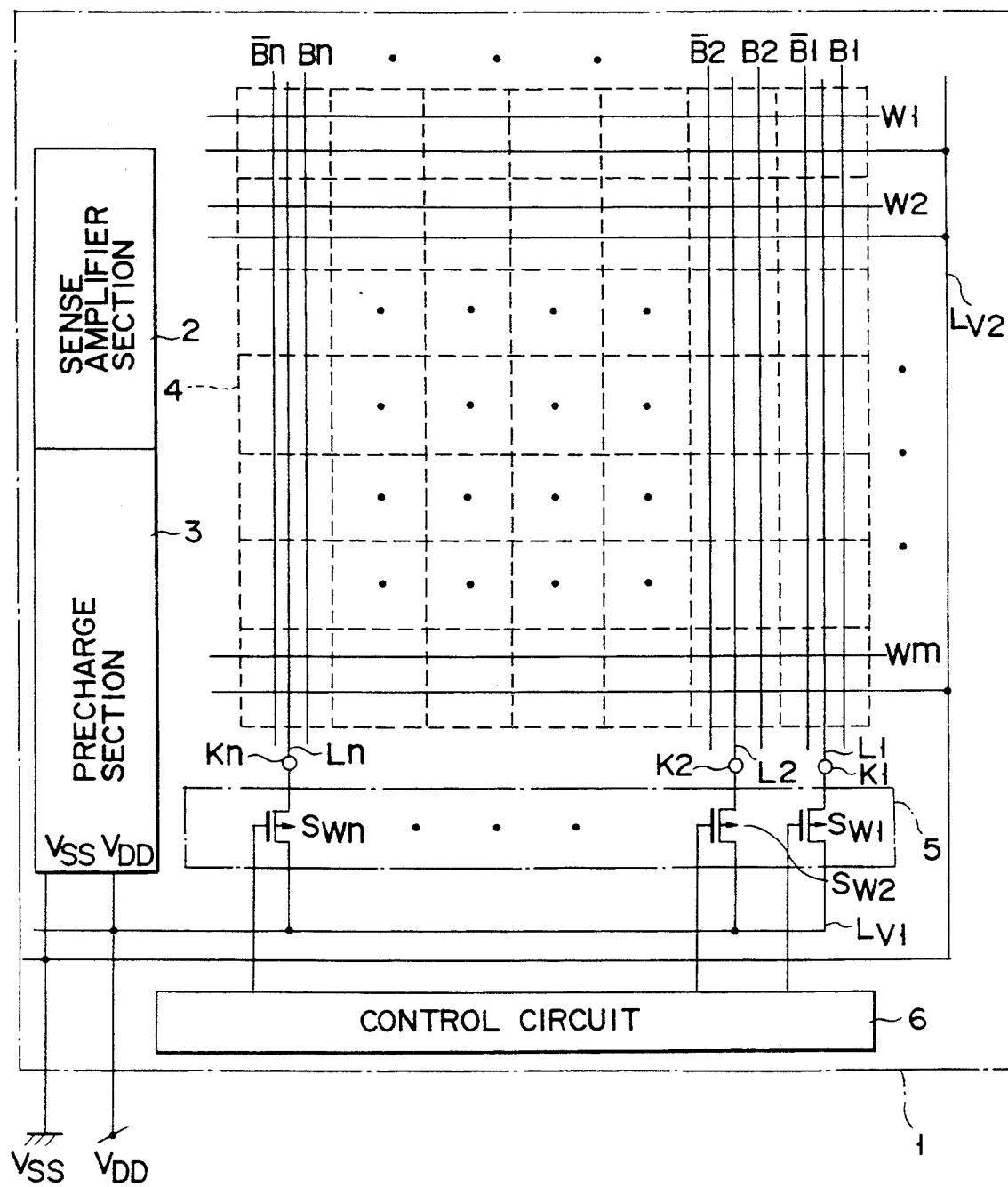
FIG. 5 is a circuit diagram showing a semiconductor memory device according to the third embodiment of the present invention.

FIG. 5 shows a semiconductor memory device according to the third embodiment of the present invention.

A memory cell array 4 obtained by arranging n×m memory cells in an array form is formed on a memory cell section 1. The high-resistance elements (not shown) of the n×m memory cells are connected to predetermined terminals $K_l$ to $K_n$ by low-resistance lines $L_l$ to $L_n$, respectively. That is, the low-resistance lines $L_l$ to $L_m$ are arranged parallelly to bit lines $B_l$ to $B_n$ and $\overline{B_l}$ to $\overline{B_n}$ and vertically to word lines $W_l$ to $W_m$. The low-resistance lines $L_l$ to $L_n$ are provided in units of the bit lines $B_l$ to $B_n$ and $\overline{B_l}$ to $\overline{B_n}$ and connected to the high-resistance elements of the memory cells commonly connected to the bit lines $B_l$ to $B_n$ and $\overline{B_l}$ to $\overline{B_n}$. That is, one low-resistance line is provided to one bit line, and one low-resistance line is connected to the high-resistance elements of the memory cells connected to the same bit line. In addition, switching elements Sw1 to Swn each having an ON resistance ($10^2$ to $10^4$ Ω or less) much lower than that of a high-resistance element resistance of $10^{10}$ to $10^{12}$ Ω) of a memory cell are connected between terminals $K_l$ to $K_n$ and a power source line Lvl. Note that a switching circuit 5 is constituted by the switching elements Sw1 to Swm. The opening/closing of the switching elements Sw1 to Swm is controlled by a control signal from a control circuit (e.g., decoder) 6. Note that the switching elements Sw1 to Swm are simultaneously ON/OFF-controlled, and an arbitrary number of elements may be ON/OFF-controlled.

In the second and third embodiments, the same effect as described in the first embodiment can be obtained. The switching elements Sw1 to Swm and Sw1 to Swn are arranged to each of low-resistance lines $L_l$ to $L_m$ and $L_l$ to $L_n$ arranged in units of the word lines $W_l$ to $W_m$ and the bit lines $B_l$ to $B_n$ and $\overline{B_l}$ to $\overline{B_n}$, respectively. For this reason, a power source ($V_{DD}$) can be disconnected from memory cells in unit of memory cells commonly connected to the word lines $W_l$ to $W_m$ and the bit lines $B_l$ to $B_n$ and $\overline{B_l}$ to $\overline{B_n}$. This arrangement is effective in a device in which a predetermined area must be assured due to layout limitations in a cell shape having a predetermined underlying (transistor section), as shown in an entire surface element type gate array. For example, when an underlying region for a 64-kbit memory is assured, memory elements are arranged regardless of use/nonuse of a memory cell. However, since the switching elements Sw1 to Swm and Sw1 to Swn are arranged, a leakage current from only a nonused portion can be cut off during the use of the device. Therefore, the device can be used with minimum power consumption.

FIG. 6 is a sectional view showing a semiconductor memory device according to the fourth embodiment of the present invention mounted on a chip.

In an E/R type SRAM, power source voltages $V_{DD}$ and $V_{SS}$ in a memory section 1 and power source voltages $V_{DD}$ and $V_{SS}$ in a logic section 7 are applied from the same power source pads 8a and 8b. A switching element Sw is connected between a memory cell array 4 of the memory section 1 and a power source ($V_{DD}$) line Lvl. The switching element Sw is ON/OFF-controlled by a control signal Tc from a control circuit (e.g., decoder).

As the switching elements Sw in the first to fourth embodiments, not only MOS transistors but metal (e.g., Al) lines may be used. When the metal line is used, the metal line connected to a nonused memory cell can be disconnected from the power source line Lvl by a laser beam, and a leakage current from the nonused portion can be cut off.

As described above, according to the semiconductor memory device of the present invention, the following effect can be obtained.

A switching element having an ON resistance lower than that of a high-resistance element is connected between a memory cell and a power source. For this reason, the switching element is ON/OFF-controlled to disconnect the memory cell from the power source. Therefore, in a large-capacity E/R type SRAM, leakage currents generated from a memory cell section and a logic section can be independently discriminated and evaluated. In addition, when the E/R type SRAM is used, since only a nonused memory core section can be disconnected from a power source line, the semiconductor memory device can be used while an unnecessary leakage current is cut off.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device in which a memory section and a logic section are formed on the same semiconductor chip, comprising:
   a high-resistance element constituting a memory cell;
   a low-resistance line connected to said high-resistance element;
   a power source line serving as a power source path from a power source pad;
   a control circuit for outputting a control signal; and
   a switching element arranged between said low-resistance line and said power source line, and which is controlled by said control signal from said control circuit, thereby electrically separating said memory section and said logic section from each other.

2. A device according to claim 1, wherein said switching element is a MOS transistor having a low ON resistance.

3. A semiconductor device in which a memory section and a logic section are formed on the same semiconductor chip, comprising:
   a memory cell array obtained by arranging memory cells having high-resistance elements in an array form;
   a plurality of word lines and a plurality of bit line pairs for decoding said memory cells of said memory cell arrays;
   a plurality of low-resistance lines arranged in correspondence with and along said word lines so as to be perpendicular to said bit line pairs, said low-resistance lines serving as power source lines of said memory cells and being connected to the high-resistance elements;
   a power source line serving as a power source path from a power source pad;
   a control circuit for outputting a control signal; and
   a switching circuit constituted by a plurality of switching elements arranged between said low-resistance lines and said power source lines, said switching elements being controlled by said control signal, thereby electrically separating said memory section and said logic section from each other.

4. A device according to claim 1, wherein said switching elements are MOS transistors each having a low ON resistance.

5. A semiconductor device in which a memory section and a logic section are formed on the same semiconductor chip, comprising:

a memory cell array obtained by arranging memory cells having high-resistance elements in an array form;

a plurality of word lines and a plurality of bit line pairs perpendicular thereto, said word lines serving as power source lines of said memory cells and being connected to the high-resistance elements a power source line serving as a power source path from a power source pad;

a control circuit for outputting a control signal; and a switching circuit constituted by a plurality of switching elements arranged between said low-resistance lines and said power source lines, said switching elements being controlled by said control signal, thereby electrically separating said memory section and said logic section from each other.

6. A device according to claim 1, wherein said switching elements are MOS transistors each having a low ON resistance.

7. A semiconductor device in which a memory section and a logic section are formed on the same semiconductor chip, comprising:

a high-resistance element constituting a memory cell;

a low-resistance line connected to said high-resistance element;

a power source line serving as a power source path from a power source pad;

a control circuit for outputting a control signal; and a switching element arranged between said low-resistance line and said power source line, and which is controlled by said control signal from said control circuit, thereby said switching element is completely turned off.

8. A semiconductor device in which a memory section and a logic section are formed on the same semiconductor chip, comprising:

a memory cell array obtained by arranging memory cells having high-resistance elements in an array form;

a plurality of word lines and a plurality of bit line pairs for decoding said memory cells of said memory cell arrays;

a plurality of low-resistance lines arranged in correspondence with and along said word lines so as to be perpendicular to said bit line pairs, said low-resistance lines serving as power source lines of said memory cells and being connected to the high-resistance elements;

a power source line serving as a power source path from a power source pad;

a control circuit for outputting a control signal; and a switching circuit constituted by a plurality of switching elements arranged between said low-resistance lines and said power source lines, said switching elements being controlled by said control signal, thereby said switching circuit is completely turned off.

9. A semiconductor device in which a memory section and a logic section are formed on the same semiconductor chip, comprising:

a memory cell array obtained by arranging memory cells having high-resistance elements in an array form;

a plurality of word lines and a plurality of bit line pairs perpendicular thereto, said word line serving as power source lines of said memory cells and being connected to the high-resistance elements;

a plurality of low-resistance lines which are arranged in parallel to said bit line pairs and vertically to said word lines, which serve as power source lines of said memory cells, and which are connected to the high-resistance elements;

a power source line serving as a power source path from a power source pad;

a control circuit for outputting a control signal; and a switching circuit constituted by a plurality of switching elements arranged between said low-resistance lines and said power source lines, said switching elements being controlled by said control signal, thereby said switching circuit is completely turned off.

* * * * *